United States Patent [19]
Roh

[11] Patent Number: 5,879,862
[45] Date of Patent: Mar. 9, 1999

[54] METHOD FOR PLANARIZING A NON PLANAR LAYER

[75] Inventor: Jae-Woo Roh, Seoul, Rep. of Korea

[73] Assignee: Daewoo Electronics Co., Ltd., Seoul, Rep. of Korea

[21] Appl. No.: 719,810

[22] Filed: Sep. 25, 1996

[30] Foreign Application Priority Data

Sep. 30, 1995 [KR] Rep. of Korea .................. 1995 33522

[51] Int. Cl.$^6$ ...................................................... G03F 7/00
[52] U.S. Cl. ........................... 430/314; 430/318; 438/697; 216/38
[58] Field of Search .................................... 430/314, 315, 430/318; 438/697, 699; 216/38

[56] References Cited

U.S. PATENT DOCUMENTS

| | | | |
|---|---|---|---|
| 4,689,113 | 8/1987 | Balasubramanyam et al. | 430/314 |
| 4,783,238 | 11/1988 | Roesner et al. | 430/314 |
| 5,053,318 | 10/1991 | Gulla et al. | 430/315 |
| 5,149,615 | 9/1992 | Chakravorty et al. | 430/314 |
| 5,284,804 | 2/1994 | Moslehi | 438/697 |

FOREIGN PATENT DOCUMENTS 405347468A 12/1993 Japan .

*Primary Examiner*—Kathleen Duda
*Attorney, Agent, or Firm*—Anderson, Kill & Olick, P.C.

[57] ABSTRACT

A method for planarizing a non-planar layer includes the steps of (a) forming a dielectric layer on top of the non-planar layer, the dielectric layer having protuberances due to the non-planar layer; (b) applying a seed layer on top of the dielectric layer, the seed layer having humps due to the protuberances of the dielectric layer; (c) forming a photo-resist layer on top of the seed layer; (d) patterning and partially removing portions of the photoresist layer to thereby expose parts of a top surface of the seed layer; (e) forming a conductive layer on top of each of the exposed parts of the seed layer; (f) removing remaining portions of the photoresist layer until the seed layer thereunder is exposed; (g) removing parts of the photoresist layer still remaining, the seed layers protruding between the conductive layers and parts of the dielectric layer in such a way that the protuberances in the dielectric layer are completely removed; and (h) removing each conductive layer and the seed layer thereunder.

16 Claims, 3 Drawing Sheets

METHOD FOR PLANARIZING A NON PLANAR LAYER

FIELD OF THE INVENTION

The present invention relates to a planarization; and, more particularly, to an improved method for planarizing a non-planar layer by utilizing an electroplating method.

BACKGROUND OF THE INVENTION

As is well-known, a conductive layer is often formed on a substrate in manufacturing various electronic parts, e.g., thin film magnetic heads or very-large-scale integration (VLSI) chips, to electrically connect components located on the substrate. As the number of components on the substrate increases, a single conductive layer cannot accommodate all the components therein, and it becomes necessary to use a number of multiple conductive layers stacked on top of another, with a layer of insulating material between two successive conductive layers.

However, each conductive layer has a non-negligible finite thickness and in forming the stack of conductive layers, the thickness usually causes forming protuberances on the insulating layer placed on top of the respective conductive layer, the protuberances making it progressively difficult to stack the conductive layers on top of another. Further, there are additional difficulties associated with this method, one of them being that, in order to obtain the protuberances with sides that are not too steep, the respective conductive layer must first be patterned in such a way that sides thereof are not too steep, and this involves a number of difficult processing steps.

SUMMARY OF THE INVENTION

It is, therefore, an object of the present invention to provide a method for planarizing a non-planar layer by employing an electroplating process.

In accordance with the present invention, there is provided a method for planarizing a non-planar layer, the method comprising the steps of: (a) forming a dielectric layer on top of the non-planar layer, the dielectric layer having protuberances due to the non-planar layer; (b) applying a seed layer on top of the dielectric layer, the seed layer having humps due to the protuberances of the dielectric layer; (c) forming a photoresist layer on top of the seed layer; (d) patterning and partially removing portions of the photoresist layer to thereby expose parts of a top surface of the seed layer; (e) forming a conductive layer on top of each of the exposed parts of the seed layer; (f) removing remaining portions of the photoresist layer until the seed layer located there below is exposed; (g) removing parts of the photoresist layer still remaining, the seed layers between the conductive layers and a part of the dielectric layer in such a way that the protuberances in the dielectric layer are completely removed; and (h) removing the conductive layer and the seed layer under each of the conductive layers.

BRIEF DESCRIPTION OF THE DRAWINGS

The above and other objects and features of the present invention will become apparent from the following description of preferred embodiments, when taken in conjunction with the accompanying drawings, wherein.

DETAILED DESCRIPTION OF THE PREFERRED EMBODIMENTS

Referring to FIGS. 1A to 1H, there are shown schematic cross sectional views setting forth a planarizing method in accordance with the present invention.

Figure 1A:
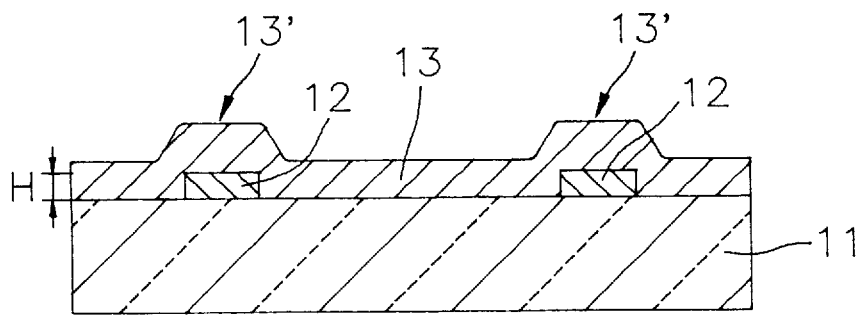
FIGS. 1A to 1H show a schematic cross sectional views for illustrating a planarizing method in accordance with the present invention.

There is shown in FIG. 1A, a substrate 11 having structures 12 made of a conductive material such as copper (Cu), gold (Au), with a height (H), and formed on a top surface thereof by using a CVD (Chemical Vapor Deposition) or a PVD (Physical Vapor Deposition) methods. Next, a dielectric layer 13 made of an insulating material, e.g., silicon dioxide ($SiO_2$) is formed on top of the substrate 11 by using an evaporation method or a sputtering method in such a way that its thickness is greater than or equal to the height (H) of the structures 12, resulting in the dielectric layer 13 having protuberances 13', each of the protuberances 13' being located on top of each of the structures 12.

Figure 1B:
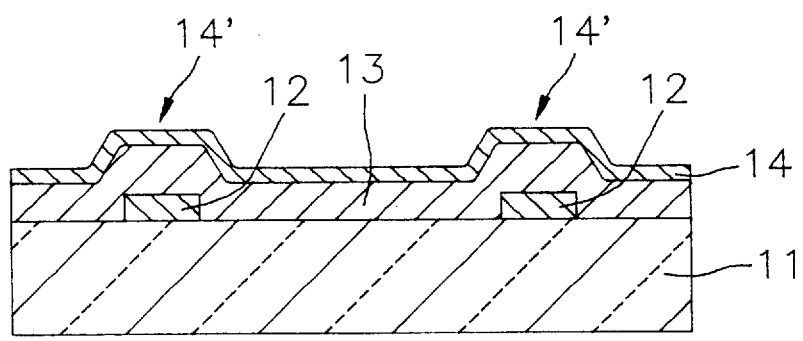

In a subsequent step, a seed layer 14 having a predetermined thickness is applied on top of the dielectric layer 13 by using an evaporation method or a sputtering method, wherein the seed layer 14 has humps 14' due to the protuberances 13' on the dielectric layer 13, as shown in FIG. 1B. In an electroplating method, the seed layer 14 is usually made of a same or compatible material with that of a conductive material to be electroplated so as to enhance an adhesion therebetween. However, since an adhesion of such a material to the silicon dioxide is poor, the seed layer 14 consists of a top layer made of, e.g., gold (Au), copper (Cu) and a bottom layer made of, e.g., a titanium (Ti) or a chromium (Cr) having a relatively good adhesion to the silicon dioxide. The thickness of the bottom layer and the top layer is respectively defined by the following equations:

$$t_1 = t\{E_1(E_2-E)\}/\{E(E_2-E_1)\} \quad \text{eq. 1}$$

$$t_2 = t\{E_2(E_1-E)\}/\{E(E_1-E_2)\} \quad \text{eq. 2}$$

wherein, t is the thickness of the seed layer 14, $t_1$ is the thickness of the bottom layer, $t_2$ is the thickness of the top layer, $E_1$ is an etching rate of the bottom layer, $E_2$ is an etching rate of the top layer, E is an etching rate of the silicon dioxide when the etching rate of the silicon dioxide is equal to that of a photoresist. Consequently, the etching rate of the seed layer 14 may be set to be similar to that of the photoresist and the dielectric layer by the aforementioned equations.

Figure 1C:
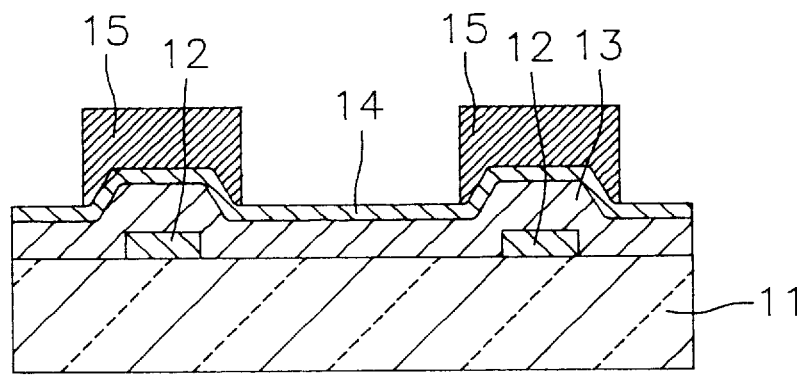

With reference to FIG. 1C, a photoresist layer 15 is formed on top of the seed layer 14 using a spin coating method, and then, the photoresist layer 15 is patterned using a photolithography method and removed by using a developer in such a way that the photoresist layer 15 remains only on the humps 14' to partially expose a top surface of the seed layer 14. Preferably, the remaining portions of the photoresist layer 15 have a greater thickness than the height of each of the humps 14'.

Figure 1D:
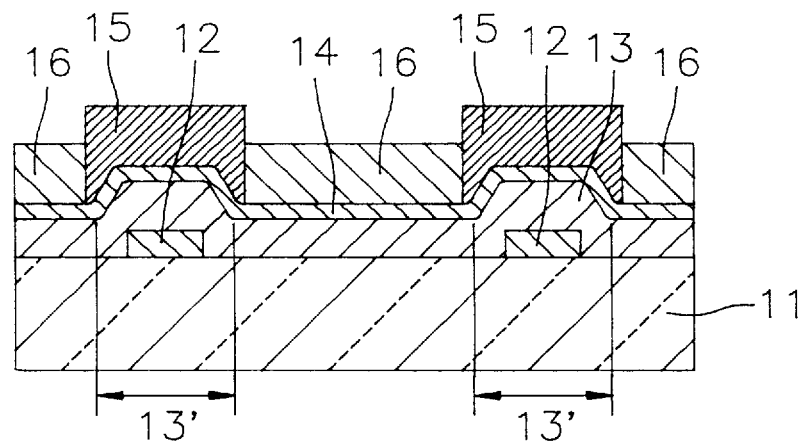

Referring to FIG. 1D, a conductive layer 16 is formed on top of the exposed part the seed layer 14 by using an electroplating method. Care must be taken to ensure that 16 has such a thickness that residue thereof is allowed to still remain after the protuberances 13' on the dielectric layer 13 are removed by using a $CF_4+O_2$ plasma reactive ion etching (RIE) which will be described in detail later (see FIG. 1F).

Figure 1E:
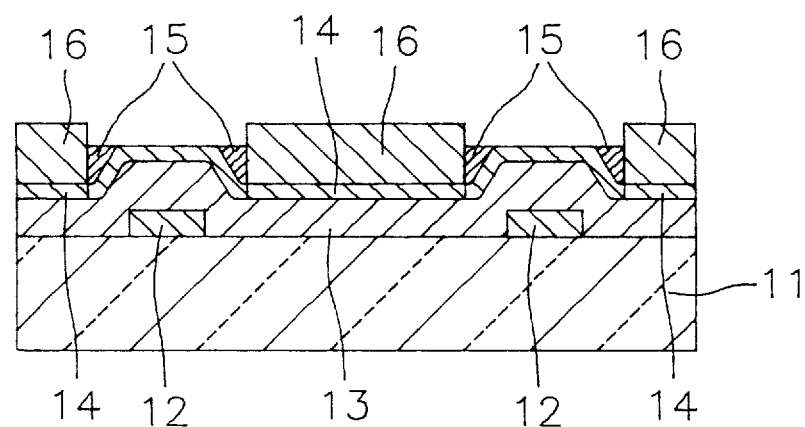

Thereafter, the remaining portions of the photoresist layer 15 are removed by using a dry etching process, for example, $O_2$ plasma reactive ion etching (RIE), until the uppermost seed layer 14 is exposed, as shown in FIG. 1E, whereby the remaining portions of the photoresist layer 15 have an identical level as that of the humps 14' of the seed layer 14.

Figure 1F:
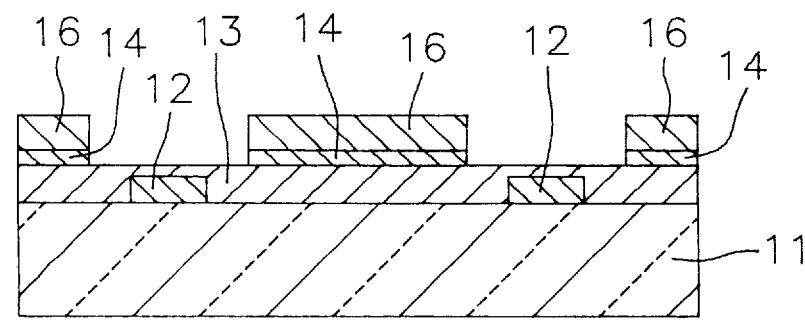

Next, the portions of the photoresist layer 15, top surfaces of which are at same level as those of the humps 14' of the seed layer 14, the humps 14' of the seed layers 14 and the protuberances 13' of the dielectric layer 13 are completely removed by using a dry etching process, for example, a $CF_4+O_2$ plasma RIE, as shown in FIG. 1F.

Figure 1G:
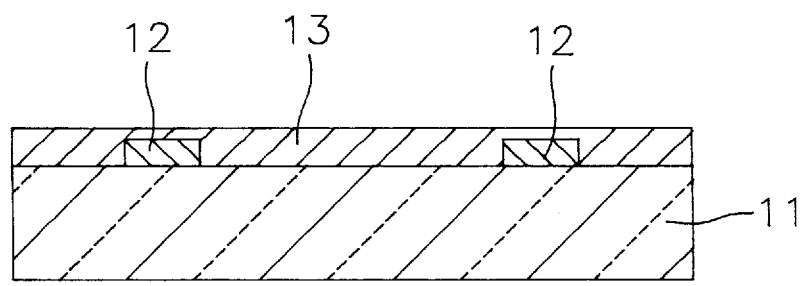
Figure 1H:
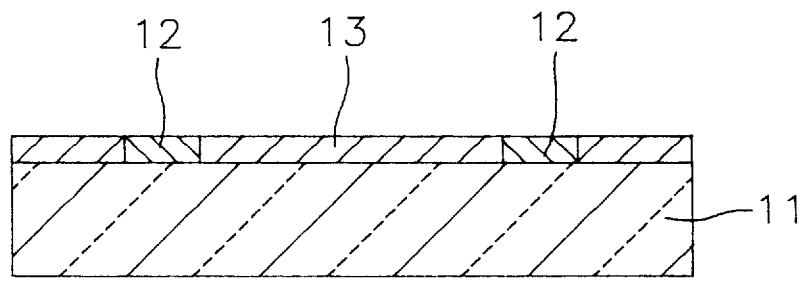

The conductive layer sixteen and the seed layer 14 under the conductive layer 16 are removed by using, e.g., a wet etching process employing, e.g., $HNO_3$ or $H_2SO_4$, etc, as an etchant, as shown in FIG. 1G. Finally, top of the dielectric layer 13 is removed until the structures 12 are exposed by using either a dry etching process, e.g., $CF_4$ plasma RIE or a wet etching process employing, e.g., HF as an etchant, as shown in FIG. 1H, thereby providing a relatively smooth surface onto which a next level can be easily applied.

While the present invention has been described with respect to certain preferred embodiments only, other modifications and variations may be made without departing from the spirit and scope of the present invention as set forth in the following claims.

What is claimed is:

1. A method for planarizing a non-planar layer comprising the steps of:

forming a first layer on top of the non-planar layer, the first layer having protuberances due to the non-planar layer;

applying a seed layer on top of the first layer, the seed layer having humps due to the protuberances of the first layer;

forming a photoresist layer on top of the seed layer;

patterning the photoresist layer in such a way that the photoresist layer remains only on the humps to partially expose a top surface of the seed layer;

forming a conductive layer on the exposed top surface of the seed layer;

removing the portions of the photoresist layer on the humps until the uppermost seed layer is exposed, whereby top surfaces of the remaining portions of the photoresist layer are at same level as those of the humps;

removing the remaining portions of the photoresist layer, the humps in the seed layer and the protuberances in the first layer; and removing the conductive layer and the seed layer.

2. The method of, claim 1, wherein the first layer is made of a dielectric material.

3. The method of claim 1, wherein the conductive layer is formed by using an electroplating method.

4. The method of claim 3, wherein the conductive layer has such a thickness that residue thereof is allowed to still remain after the protuberances in the first layer are removed.

5. The method of claim 1, wherein the remaining portions of the photoresist layer are removed by using a dry etching process.

6. The method of claim 5, wherein the dry etching process is $O_2$ plasma reactive ion etching.

7. The method of claim 1, wherein the removal of the remaining photoresist layer, the humps in the seed layer and the protuberances in the first layer is carried out by using a dry etching process.

8. The method of claim 7, wherein the dry etching process is $CF_4+O_2$ plasma reactive ion etching.

9. The method of claim 1, wherein the removal of the conductive layer and the seed layer is carried out by using a wet etching process.

10. The method of claim 9, wherein an etchant used in the wet etching process is $HNO_3$ or $H_2SO_4$.

11. The method of claim 1 further comprising, after the removal of the conductive layer and the seed layer, a step of removing the first layer until the non-planar layer is exposed.

12. The method of claim 11, wherein the removal is carried out by using a dry etching process.

13. The method of claim 12, wherein the etching process is $CF_4$ plasma reactive ion etching.

14. The method of claim 11, wherein the removal is carried out by using a wet etching process.

15. The method of claim 14, wherein an etchant used in the wet etching process is HF.

16. The method of claim 1, wherein the said layer includes a top layer of a conductive material and a bottom layer made of a material which adheres to the first layer and further comprising the step of controlling the etching rate of the seed layer to coincide with the etching rate of the photoresist and the first layer.

* * * * *

UNITED STATES PATENT AND TRADEMARK OFFICE
CERTIFICATE OF CORRECTION

PATENT NO. : 5,879,862
DATED : March 9, 1999
INVENTOR(S) : Jae-Woo Roh

It is certified that error appears in the above-identified patent and that said Letters Patent is hereby corrected as shown below:

On the title page,:

[30] Foreign Application Priority Data

Sep. 30, 1995  [KR]  Rep. of Korea   95-33522

Signed and Sealed this

Third Day of August, 1999

*Attest:*

Q. TODD DICKINSON

*Attesting Officer*  *Acting Commissioner of Patents and Trademarks*